(12) United States Patent
Wu

(10) Patent No.: US 10,903,255 B2
(45) Date of Patent: Jan. 26, 2021

(54) IMAGE SENSOR FLIP CHIP PACKAGE

(71) Applicant: SEMICONDUCTOR COMPONENTS INDUSTRIES, LLC, Phoenix, AZ (US)

(72) Inventor: Weng-Jin Wu, Hsinchu (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 50 days.

(21) Appl. No.: 16/183,873

(22) Filed: Nov. 8, 2018

(65) Prior Publication Data

US 2020/0152681 A1 May 14, 2020

(51) Int. Cl.
*H01L 27/146* (2006.01)

(52) U.S. Cl.
CPC .. *H01L 27/14623* (2013.01); *H01L 27/14618* (2013.01); *H01L 27/14636* (2013.01); *H01L 27/14685* (2013.01)

(58) Field of Classification Search
CPC combination set(s) only.
See application file for complete search history.

(56) References Cited

U.S. PATENT DOCUMENTS

| 2011/0024862 | A1 | 2/2011 | Tu et al. |
| 2013/0020665 | A1 | 1/2013 | Oganesian |
| 2015/0340397 | A1* | 11/2015 | Seo ............... H01L 27/14623 257/432 |
| 2017/0154913 | A1* | 6/2017 | Jun ..................... H01L 24/97 |
| 2018/0211989 | A1* | 7/2018 | Hogyoku ............ G02B 7/021 |
| 2018/0247962 | A1* | 8/2018 | Wang ............ H01L 27/14636 |

* cited by examiner

*Primary Examiner* — Nduka E Ojeh
(74) *Attorney, Agent, or Firm* — Adam R. Stephenson, Ltd.

(57) ABSTRACT

Implementations of semiconductor packages may include: a semiconductor device included within a cavity within a glass block. The package may also include a substrate coupled with a first side of the semiconductor device and two or more edges of the glass block. A fill material may be included between the substrate and the second conductor device and an opaque material may be between a side surface of the semiconductor device and an inner surface of the cavity. The opaque material may be configured to block light from contacting the side surface of the semiconductor device.

20 Claims, 15 Drawing Sheets

IMAGE SENSOR FLIP CHIP PACKAGE

BACKGROUND

1. Technical Field

Aspects of this document relate generally to semiconductor packages, such as image sensor devices. Particular implementations may be used in cameras or medical imaging devices.

2. Background

Semiconductor devices may include image sensor die coupled to a substrate through wire bonds over which a transparent sheet of material is used to expose the die to light. Pixels in the die then receive the light through the transparent material and generate signals that are processed to form an image.

SUMMARY

Implementations of semiconductor packages may include: a semiconductor device included within a cavity within a glass block. The package may also include a substrate coupled with a first side of the semiconductor device and two or more edges of the glass block. A fill material may be included between the substrate and the semiconductor device and an opaque material may be between a side surface of the semiconductor device and an inner surface of the cavity. The opaque material may be configured to block light from contacting the side surface of the semiconductor device.

Implementations of semiconductor packages may include one, all, or any of the following:

The semiconductor device may be coupled to the substrate through solder.

The package may include vias within the semiconductor device.

The semiconductor device may be an image sensor.

The package may include two or more standoff structures between the inner cavity within the glass block and a second side of the semiconductor.

The package may include a plurality of metal traces within the inner surface of the cavity.

Solder balls may be between the second side of the semiconductor device and the metal traces.

The cavity may have a shape that is cuboidal.

Implementations of methods of forming semiconductor packages may include: forming a cavity within a glass block and coupling two or more standoff units to an inner surface of the cavity. The method may also include bonding a semiconductor device to the two or more standoffs and sealing the semiconductor device within the cavity using an opaque filling material. The opaque filling material may be configured to block light from contacting an edge of the semiconductor device. The method may also include mechanically and electrically coupling a substrate to the semiconductor device and over an opening of the cavity. The method may also include underfilling a gap between the substrate, the semiconductor device, and a side of the glass block surrounding the cavity with an underfill material.

Implementations of method of forming semiconductor packages may include one, all, or any of the following:

The method may include coupling a ball grid array to a second side of the substrate.

The substrate may be coupled to the semiconductor device through solder.

The semiconductor device may be an image sensor.

Vias may be included within the semiconductor device.

The method may include mechanically and electrically coupling a substrate to the semiconductor device may further include solder balls.

Implementations of methods of forming semiconductor packages may include: forming a cavity within a glass block and coupling a plurality of metal traces to an inner surface of the cavity. The method may include bonding a semiconductor device into the cavity and sealing the semiconductor device within the cavity using an opaque filling material. The method may include mechanically and electrically coupling a substrate to the semiconductor device and over an opening of the cavity. The method may also include underfilling a gap between the substrate, the semiconductor device, and a side of the glass block surrounding the cavity using an underfill material. The opaque filling material may be configured to block light from contacting an edge of the semiconductor device.

Implementations of a method of forming semiconductor packages may include one, all, or any of the following:

The method may include coupling a ball grid array to a second side of the substrate.

The substrate may be coupled to the semiconductor device through solder.

The semiconductor device may be an image sensor.

Vias may be included within the semiconductor device.

Bonding may further include bonding solder balls between the second side of the semiconductor device and the metal traces.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
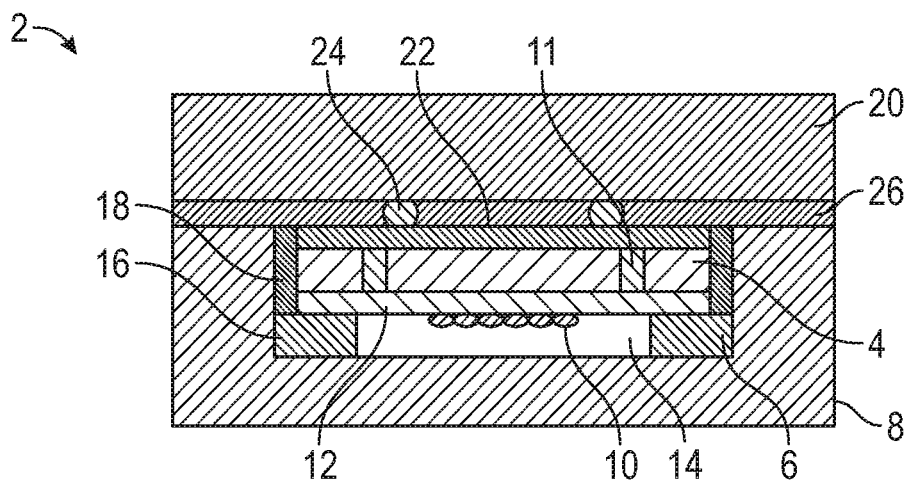
FIG. 1 is a cross sectional view of an implementation of a semiconductor package.

Referring to FIG. 1, an implementation of a semiconductor package 2 is illustrated. As illustrated, the semiconductor package 2 includes a semiconductor device 4 bonded within a cavity 6. The cavity 6 is formed within a glass block 8. In various implementations, the cavity may be formed through etching or casting. The use of a single piece glass block may provide strong glass cavity protection. The higher level of protection may allow the device to pass higher level reliability criteria. In this document, for the exemplary purposes of this disclosure, the material of the block 8 is referred to as glass, however, in various implementations, the material of the block may be a wide variety of materials, such as, by non-limiting example, plastic, polymers, silicon, ruby, sapphire, and any other optically transmissive material. In some implementations, the block may be made of a material not transmissive to visible light, but to non-visible light or other wavelengths of electromagnetic radiation, such as, by non-limiting example, infrared light, ultraviolet light, radar, microwave, radio waves, or any other type of electromagnetic radiation. Correspondingly, the semiconductor die included in the various package implementations disclosed herein may include any sensor type designed to detect/respond to any of the types of electromagnetic radiation disclosed in this document.

In the implementation illustrated in FIG. 1, the semiconductor device 4 is an image sensor having a colorfilter array (CFA) and microlens (μLens) 10 on the active area of the die. In other implementations, other lenses, filters, or image sensing devices may be included. The CFA and μLens 10 are coupled to a sensor site interconnect 12. An air cavity 14 is disposed around the CFA and μLens 10 on the die. The device as described herein may provide a better window to the active area of the die and allow for a smaller air cavity between the glass and the lenses. The semiconductor device also includes vias 11 coupling the lenses 10 to other parts of the die. In various implementations, the vias 11 may be through silicon vias (TSV). In other implementations, the die may be formed of material other than silicon such as, by non-limiting example, silicon-on-insulator, ruby, sapphire, germanium, antimony, arsenic, tellurium, gallium arsenide, indium antimonide, the oxides of metals, any combination thereof, or other suitable semiconductor material.

In the particular implementation illustrated in FIG. 1, the image sensor is positioned on standoff units 16 within the cavity 6. In various implementations, two or more standoff units may be included in the package. It should be understood that a cross sectional view of the package is illustrated where only two standoff units are visible. In some implementations, four standoff units may be included where a standoff unit is positioned in each corner of where the cavity has a shape that is cuboidal. In other implementations, a single standoff unit may be used that connects the four corners of the cavity. The standoff units may be used for electrical connection in some implementations. In various implementations, standoff units for electrical connection may be formed of metal, solder, or conductive adhesive. Standoff units may include gold studs, copper bumps, lead tin bumps, nickel or other solder material. In implementations where the standoff units do not have an electrical connection function, the standoff units may be formed of polymer material, glass, ceramic, or other non-conductive material. The standoff units may control the gap size/distance between the sensor array and the dimensions of the cavity.

As illustrated, an optically opaque material 18 is included between the sides of the surface of the semiconductor device 4 and the inner surface of the cavity 6. The opaque material may form a hermetic seal between the semiconductor device and the glass. In various implementations, the opaque material may include a light block material where the opaque material is optically opaque blocking desired wavelengths of light but not all wavelengths of light. In various implementations, the wavelengths of light that are blocked may be in the visible spectrum of light. In other implementations, other wavelengths of light may be blocked, include any wavelengths corresponding with any electromagnetic radiation type disclosed in this document.

As illustrated in FIG. 1, a substrate 20 is coupled to a first side 22 of the semiconductor device 4 and the corresponding edges of the glass block 8. In various implementations, the substrate may be an embedded substrate. In implementations with an embedded substrate, one or more devices may be embedded within the substrate. The embedded devices may be passive devices, active devices, or a combination of both passive and active devices. The substrate 20 may be coupled to two or more edges of the glass block. The use of a glass block may decrease heating induced stress for the semiconductor package because glass has a coefficient of thermal expansion (CTE) that is similar to the CTE of silicon. The semiconductor device 4 may be coupled to the substrate through solder balls as illustrated. In various implementations, the semiconductor device may be coupled to the substrate through other materials. In some implementations, no wire bonds may be between the semiconductor device and the substrate. Use of a flip chip style of bonding between the semiconductor device and substrate may reduce bonding space and allow for smaller package footprints. A fill material 26 is included between the substrate and the semiconductor device. The fill material may provide insulation for the electrical connections of the semiconductor device. It may also provide stress relief/support/bonding between the substrate and the semiconductor device. In other implementations, wire bonds may be used to couple the die to the substrate.

Figure 2:
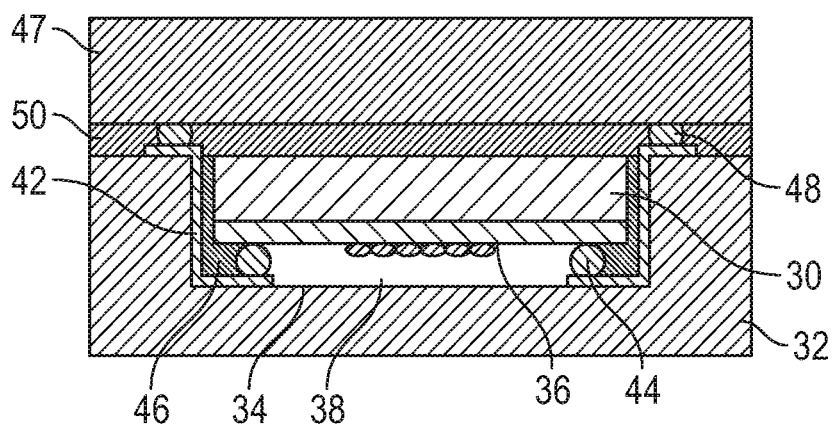
FIG. 2 is a cross sectional view of an another implementation of a semiconductor package.

Referring to FIG. 2, another implementation of a semiconductor package is illustrated. This implementation includes a semiconductor device 30 placed within a cavity 34 of a glass block 32. In various implementations, the semiconductor device 30 may be an image sensor having lenses 36 on a second side of the semiconductor device. The lenses may be any lens type disclosed herein. As illustrated, the lenses 36 are surrounded by an air cavity 38. The glass block includes a plurality of metal traces 42 within the inner surface of the cavity 34. The semiconductor device is electrically coupled to the metal traces through solder balls 44. In various implementations, other interconnects may be used such as by non-limiting example, gold studs or any other interconnect type described herein. The metal traces 42 extend along the inner surface of the cavity to the outer edges of the glass block. An optically opaque material 46 is between a side surface of the semiconductor device 30 and the inner surface of cavity. The opaque material may block desired wavelengths of light and may be any optically opaque material type disclosed herein. The opaque material may form a hermetic seal between the semiconductor device and cavity.

As illustrated, a substrate 47 is mechanically and electrically coupled to the image sensor device through solder balls 48 positioned on the metal traces 42. In various implementations, the electrical connections between the substrate and the semiconductor device may be gold, copper, nickel, lead/tin, or any other solder material. In some implementations, a metal joint ring (not shown) may be included on an outer edge of the package to form a hermetic seal. In such implementations, the metal joint ring may not be used for electrical connection and may be placed so as to be electrically isolated from the sensor device and other components. A fill material 50 is place between the edge of the glass block 32, the semiconductor device 30, and the substrate 47. The fill material may be a sealant. The fill material may also insulative to the electrical connections and may provide any of the other functions of fill materials disclosed herein.

Figure 3:
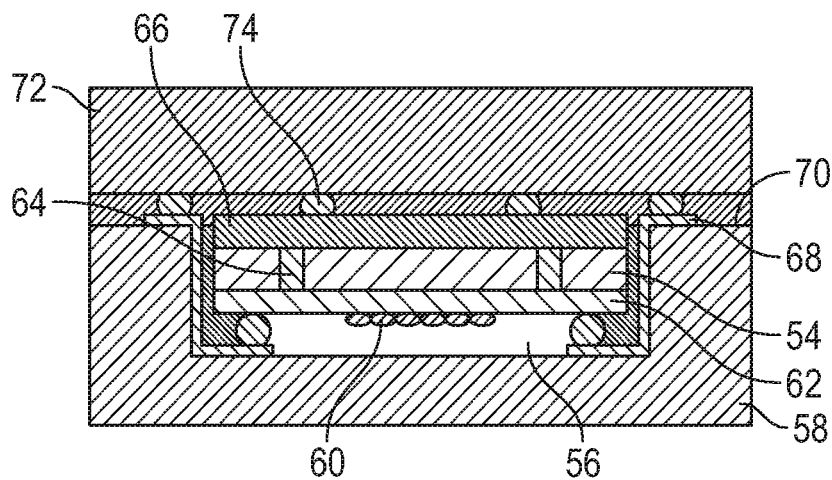
FIG. 3 is a cross sectional view of an another implementation of a semiconductor package.

Referring to FIG. 3, another implementation of a semiconductor package 52 is illustrated. The package includes a semiconductor device 54 coupled inside a cavity 56 within glass block 58. As illustrated, the semiconductor device 54 is an image sensor die having a sensor region 60 on a second side of the image sensor die. The image sensor also has a sensor site interconnection 62 similar to that as illustrated in other implementations in this document. The image sensor die 54 also includes vias 64 extending from the sensor site interconnection 62 to the redistribution layer 66 on the first side of the image sensor die.

As illustrated, this implementation also includes metal traces 68 within the inner surface of the glass cavity 56. The metal traces extend from inner cavity to the outer edge 70 of the glass block 58. The image sensor die is mechanically and electrically coupled to the metal traces through two or more solder balls. In various implementations, the solder balls or interconnects may be formed of gold, nickel, copper, lead/tin, or any other suitable electrically conductive material. A substrate 72 is coupled with the first side of the image sensor 54 and the edges 70 of the glass block 58 through four interconnects 74. In various implementations, the interconnects may be solder balls. In some implementations, the substrate may be coupled through two or more interconnects. A fill material is also placed between the substrate 72 and the semiconductor device 54. The fill material may provide a seal to the package. The fill material may also provide insulation for the electrical connections and may perform any of the other functions of fill materials disclosed in this document.

Figure 4:
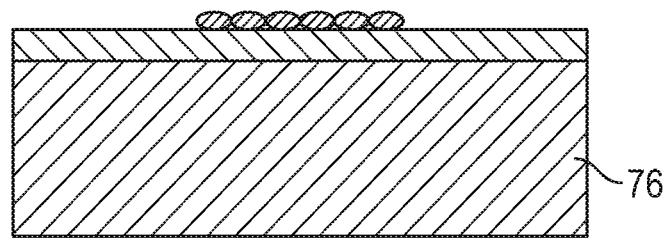
FIG. 4 is a cross sectional view of an implementation of an image sensor wafer.
Figure 5:
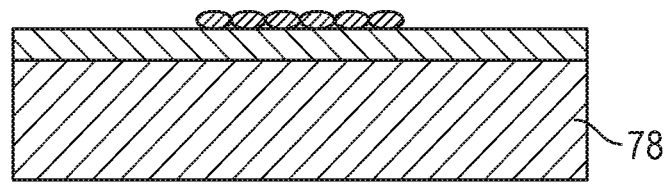
FIG. 5 is a cross section view of an implementation of an image sensor wafer after thinning.
Figure 6:
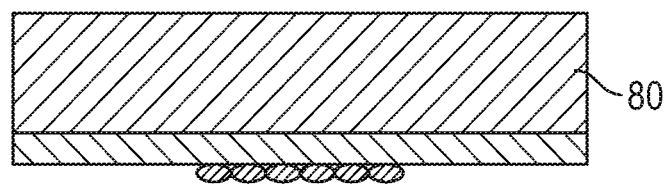
FIG. 6 is a cross sectional view of an implementation of an image sensor wafer/die flipped.

Referring to FIGS. 4-11, implementations of various methods of forming an image sensor die are illustrated. Referring to FIG. 4, an image sensor wafer 76 is provided. In FIG. 5, the image sensor wafer 78 is illustrated after having been thinned. The wafer may be thinned by any suitable method such as by non-limiting example, backgrinding, lapping, wet etching, any combination thereof, or any other technique for removing backside damage and/or the material of the semiconductor substrate substantially uniformly across the largest planar surface of the substrate. Referring to FIG. 6, the wafer 80 is illustrated after having been flipped. The wafer may be coupled to a backgrinding tape and flipped using the tape. In other implementations, the wafer may be singulated into individual die and then the die may be flipped. While singulated, the individual dies may be coupled to a picking tape thereby making flipping easier. Though in other implementations, the dies may be individually flipped through a pick and place process into carrier tape.

Figure 7:
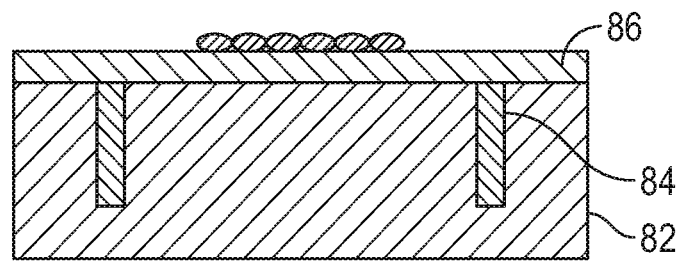
FIG. 7 is a cross sectional view of an implementation of an image sensor wafer/die having vias therethrough.
Figure 8:
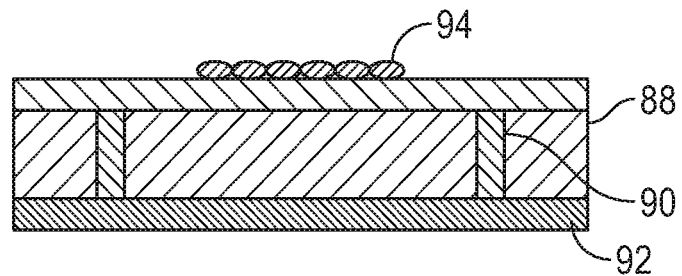
FIG. 8 is a cross sectional view of an implementation of an image sensor wafer/die thinned and having a redistribution layer.
Figure 10:
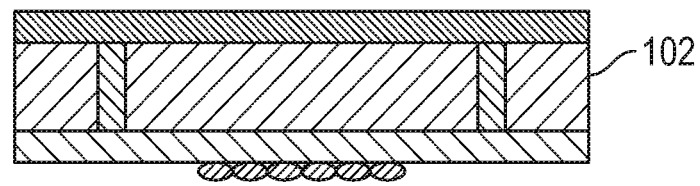
FIG. 10 is a cross sectional view of an implementation of an image sensor die flipped.

Referring to FIG. 7, an image sensor wafer/die 82 having vias 84 is illustrated. In some implementations, the vias 84 are through silicon vias (TSV) when the wafer is made of silicon. They may be through oxide vias where the wafer includes oxides. In various implementations, various semiconductor wafers may be used for image sensor dies. The vias provide a pathway for electrical connection between the sensor site interconnection 86 and other areas of the die and associated packaging. Referring to FIG. 8, the image sensor wafer 88 is illustrated after having been thinned. Thinning may be performed through any method described herein. As illustrated, the thinning exposes the vias 90 for interconnection. A redistribution layer 92 is illustrated after having been formed on a side of the wafer 88 opposite the sensing region 94. In some implementations, a passivation layer may be formed on the wafer opposite the sensing region. Referring to FIG. 10, the method from FIG. 8 includes flipping the image sensor wafer 102. The wafer may be coupled to a backgrinding tape and flipped while being mounted to new tape. In various implementations, the wafer may be singulated into individual die after thinning. The individual die may be then flipped as part of semiconductor package manufacturing using a pick and place process into a carrier tape.

Figure 9:
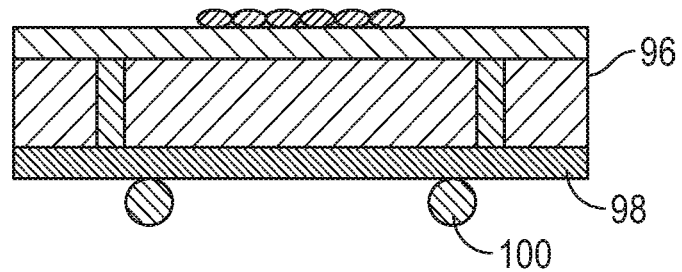
FIG. 9 is a cross sectional view of an implementation of an image sensor die having interconnects coupled to a redistribution layer.
Figure 11:
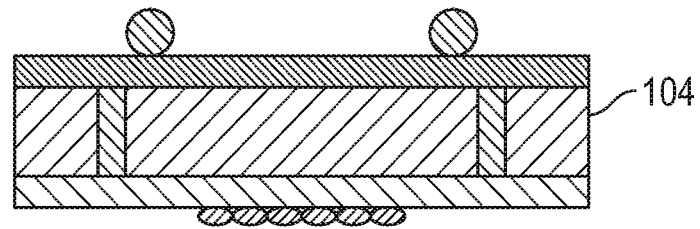
FIG. 11 is a cross sectional view of an implementation of a flipped image sensor having interconnects coupled to a redistribution layer.

Referring to FIG. 9, the method implementation for the wafer/die illustrated in FIG. 7 includes thinning the image sensor wafer 96 on a backside of the wafer, opposite the sensing region of the die. The wafer may be thinned using any method described herein such as by non-limiting example, backgrinding, wet etching, lapping, any combination thereof, or any method for removing excess material from the back of a wafer. A redistribution layer has been added to the back of the wafer and interconnects have been coupled thereto. The interconnects may include, by non-limiting example, solder balls, gold bumps, copper studs, nickel, lead/tin, or any other solder material. In FIG. 11, the wafer/die implementation illustrated in FIG. 9 is illustrated after flipping the wafer 104 for further manufacturing processes.

Figure 12:
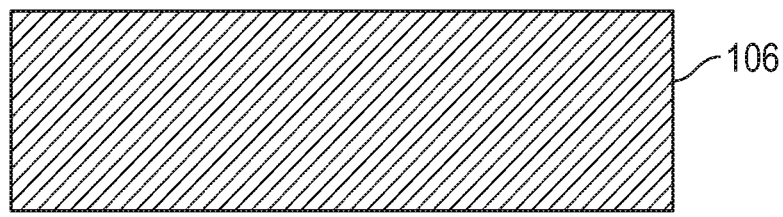
FIG. 12 is a cross sectional view of an implementation of a glass block.
Figure 13:
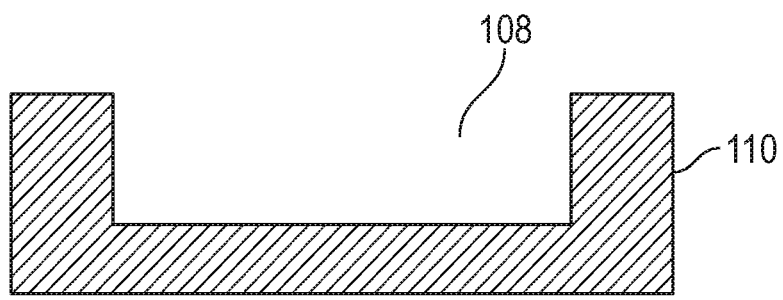
FIG. 13 is a cross sectional view of an implementation of a glass block having a cavity formed therein.

Referring to FIGS. 12-17, various phases after method steps of an implementation of a method of preparing a glass block for use in a semiconductor package are illustrated. Referring to FIG. 12, a glass block 106 is provided. The glass block may be plain glass or it may be hole patterned glass. Referring to FIG. 13, the method includes forming a cavity 108 in the glass block 110. In various implementations, the cavity 108 may be formed by etching. In some implementations, the etching may include dry etching or wet etching. In other implementations, the cavity may be formed by casting or otherwise shaping the glass. In other implementations, the cavity may include two pieces of glass bonded together. In still other implementations, the cavity may include a transparent or translucent material. In various implementations, the cavity may have a cuboidal shape.

Figure 14:
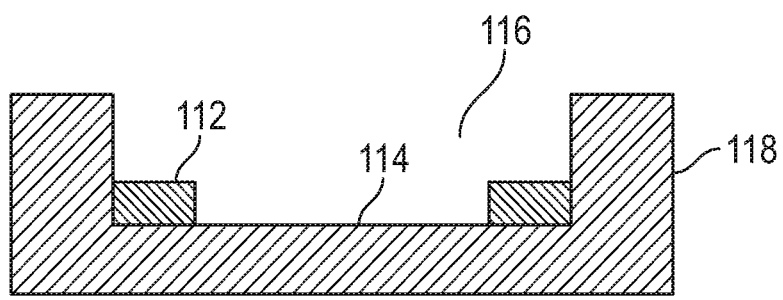
FIG. 14 is a cross sectional view of an implementation of a glass block having two standoff units coupled therein.
Figure 15:
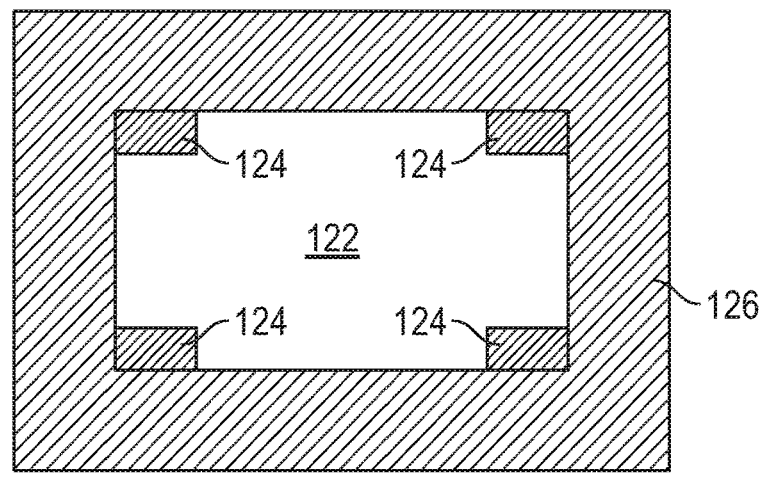
FIG. 15 is a top view of an implementation of a glass block having four standoff units coupled therein.

Referring to FIG. 14, standoffs 112 may be coupled to an inner surface 114 of the cavity 116 within the glass. The standoff units may be, by non-limiting example, polymer, glass, or ceramic in various implementations. In some implementations, glass standoffs may be integrally formed as part of the etching process. In other implementations, the standoffs may include polymer materials or other electrically insulative materials. When the standoffs are intended for electrical connection, they may be formed of, by non-limiting example, metal, solder, metal alloys, or a conductive adhesive. Metal for the standoffs may include gold studs, copper bumps, nickel, lead/tin, or other solder materials. A top view 120 of standoff 124 in a cavity 122 of a glass block 126 is illustrated in FIG. 15. In this implementation, four standoffs 124 are illustrated. In other implementations, a standoff may be a single or two-piece unit distributed around the perimeter of the cuboid shape.

Figure 16:
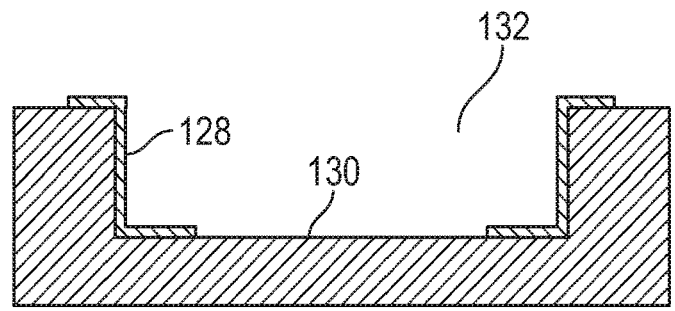
FIG. 16 is a cross sectional view of an implementation of a glass block having a plurality of metal traces therein.
Figure 17:
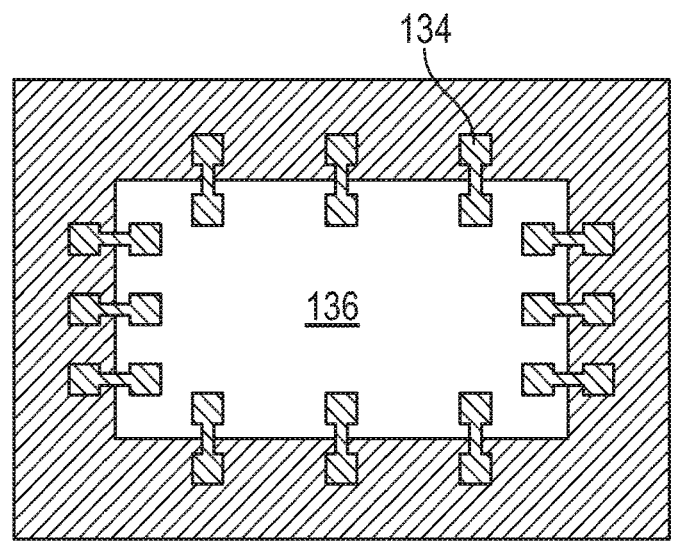
FIG. 17 is a top view of an implementation of a glass block having a plurality of metal traces therein.

Referring to FIG. 16, another implementation of a glass block is illustrated. In this implementation, metal traces 128 are coupled to an inner surface 130 of the cavity 132. A top view of the plurality of metal traces 134 coupled to the inner surface of the cavity 136 is illustrated in FIG. 17. The metal traces may be formed of, by non-limiting example, copper, gold, lead/tin, and other electrically conductive metals.

Figure 18:
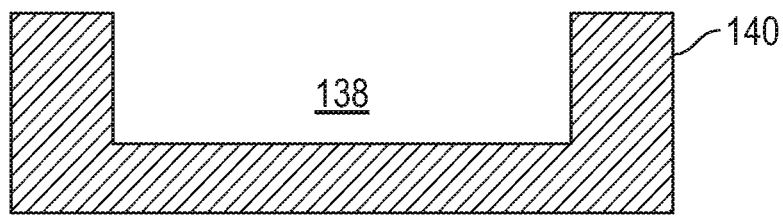
FIG. 18 is a side view of an implementation of a glass block having a cavity formed therein.
Figure 19:
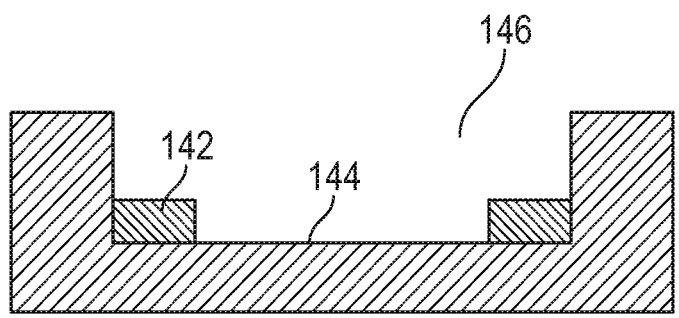
FIG. 19 is a cross sectional view of an implementation of a glass block having two standoff units coupled therein.
Figure 20:
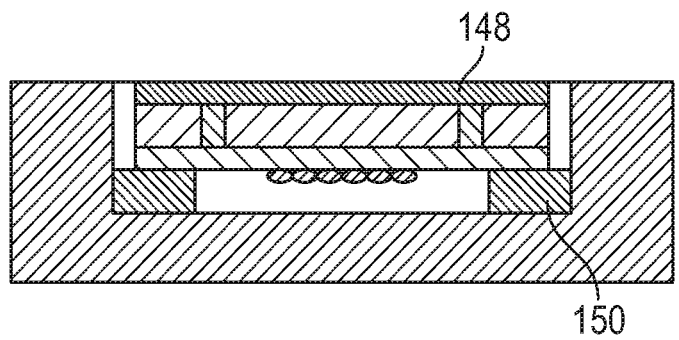
FIG. 20 is a cross sectional view of an implementation of a semiconductor device bonded into a cavity.

Referring to FIGS. 18-25, various package implementations following various steps of an implementation of a method of forming a semiconductor package are illustrated. FIG. 18 illustrates the package after forming a cavity 138 in a glass block 140. In various implementations, the cavity may be formed using any method implementation described herein. The glass used may be a plain glass in some implementations. Referring to FIG. 19, package is illustrated after coupling two or more standoffs 142 to an inner surface 144 of the cavity 146. The standoff units may be coupled to the glass through an adhesive material. In implementations not requiring the one or more standoffs to be electrically conductive, the standoffs may be of materials including polymers, glass, ceramic or other non-electrical material and any other material disclosed herein. In implementations using glass for the standoff material, the standoffs may be integrally formed as part of the etching process. In other implementations, the standoffs may for formed of electrically conductive materials such as, by non-limiting example, metal, solder, or conductive adhesives. The metals may include gold bumps, copper bumps, lead/tin, nickel, and other suitable metals. The method may further include bonding a semiconductor device 148 to the two or more standoff units 150 as illustrates in FIG. 20.

Figure 21:
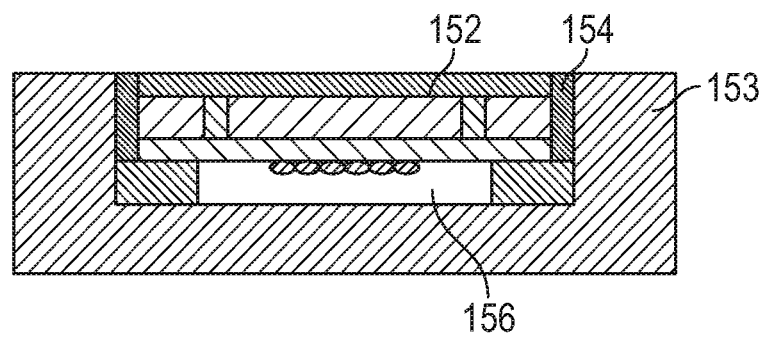
FIG. 21 is a cross sectional view of an implementation of a semiconductor device sealed within a glass block.

Referring to FIG. 21, the package is illustrated after sealing the semiconductor device 152 within the cavity using an opaque filling material 154. The opaque filling material 154 may seal any gaps between the glass block 153 and the semiconductor device 152. The opaque filling material 154 may also block light from contacting an edge of the semiconductor device. The opaque filling material may block predetermined wavelengths of light and may allow other wavelengths of light to get through. The predetermined wavelengths that are blocked may include light in the visible light spectrum in various implementations or other undesired wavelengths of electromagnetic radiation. The glass cavity structure may protect the sensor and provide stable standoff requirement of higher gap 156 of sensor to glass.

Figure 22:
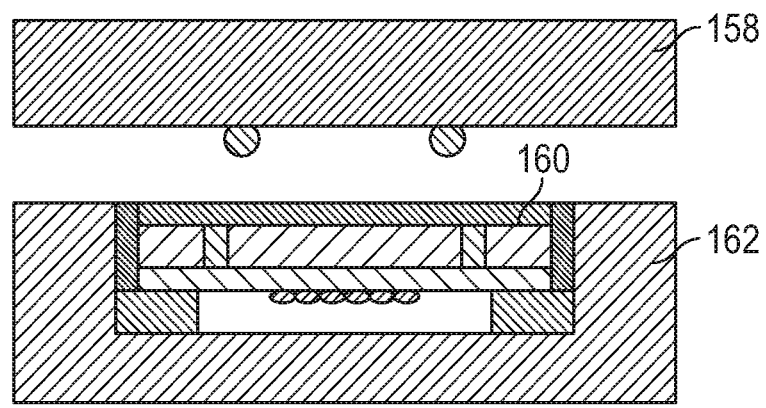
FIG. 22 is a cross sectional view of an implementation of a semiconductor device in a glass block along with a substrate.

Referring to FIG. 22, in various implementations, a substrate 158 is picked through a pick and place system and readied for placement over the semiconductor device 160. The substrate may be singulated or formed individually. In various implementations, the substrate may be an embedded substrate. In implementations with an embedded substrate, one or more devices may be embedded within the substrate.

Figure 23:
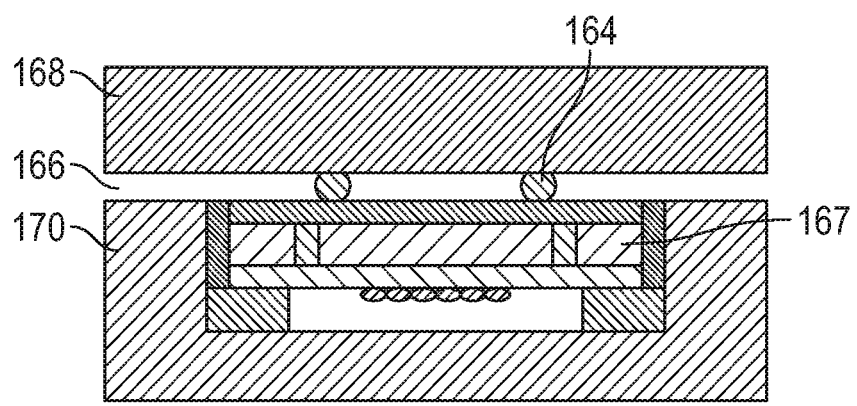
FIG. 23 is a cross sectional view of an implementation of a substrate coupled to an image sensor and over an opening of the cavity.

The embedded devices may be passive devices, active devices, or a combination of both passive and active devices. FIG. 23 illustrates the package after mechanically and electrically coupling the substrate 158 to the semiconductor device 160 and over an opening of the cavity in the glass block 162. Referring to FIG. 23, two solder balls 164 are illustrated in electrical contact with the first side of the semiconductor device. The use of flip chip bonding may provide for a narrow space of the die edge to the sensor array to be designed. Flip chip packaging may provide the shortest possible connections, lower inductance, higher frequency, better noise control, higher density, small device footprints, and lower device profiles. Flip chip processing can also utilize the full active area of the first side of the die.

Figure 24:
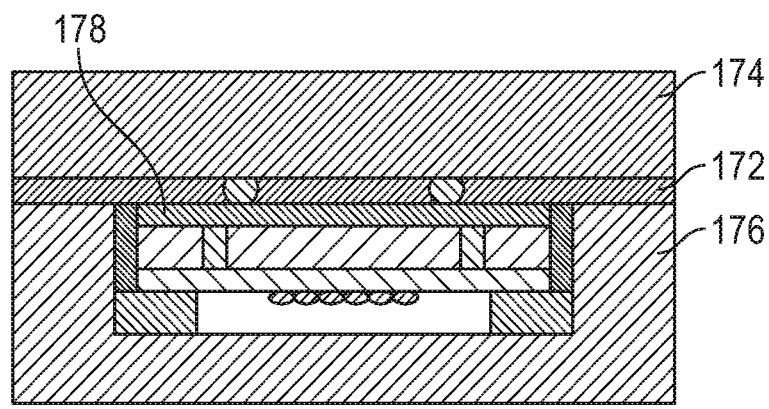
FIG. 24 is a cross sectional view of an implementation of a semiconductor package.
Figure 25:
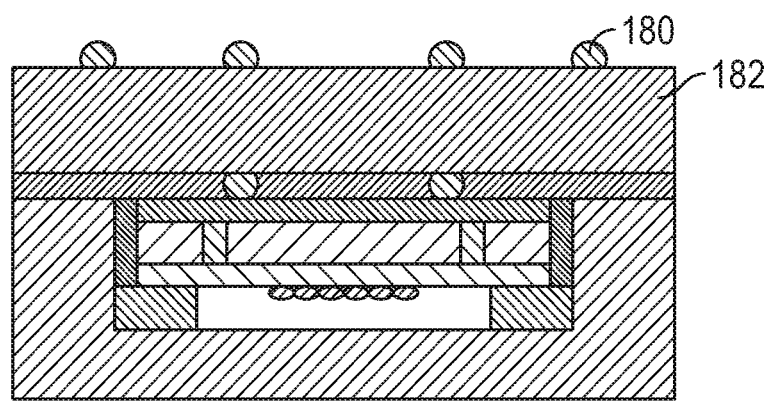
FIG. 25 is a cross sectional view of an implementation of a semiconductor device having interconnects coupled thereto.

FIG. 24 illustrates the package after underfilling a gap 166 between the substrate 168, the semiconductor device 167, and edges of the glass block 170 surrounding the cavity. As illustrated in FIG. 24, the gap is filled with a fill or underfill 172 material. The underfill material may insulate the electrical connections and provide a seal for the semiconductor package. FIG. 25 illustrates the package after coupling interconnects 180 to a first side of the substrate 182 as illustrated in FIG. 25. The interconnects may include a ball grid array (BGA), land grid array (LGA), pin grid array (PGA), individual solder balls, gold bumps, copper bumps, lead/tin bumps, or other suitable interconnect material used in semiconductor packages.

Figure 26:
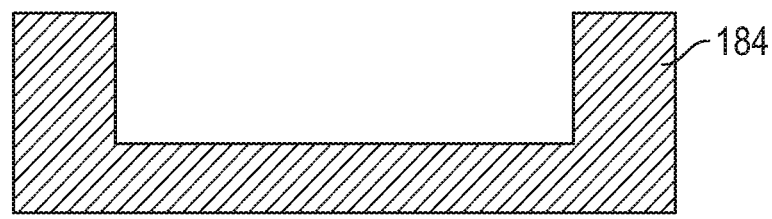
FIG. 26 is a side view of an implementation of a glass block having a cavity formed therein.
Figure 27:
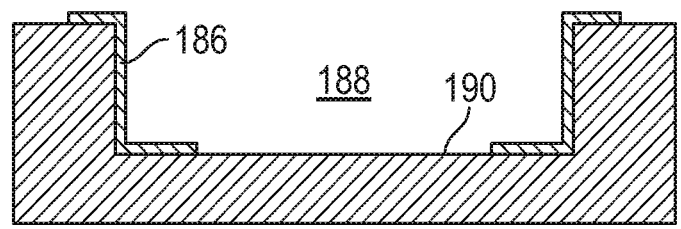
FIG. 27 is a cross sectional view of an implementation of a glass block having a plurality of metal traces therein.
Figure 28:
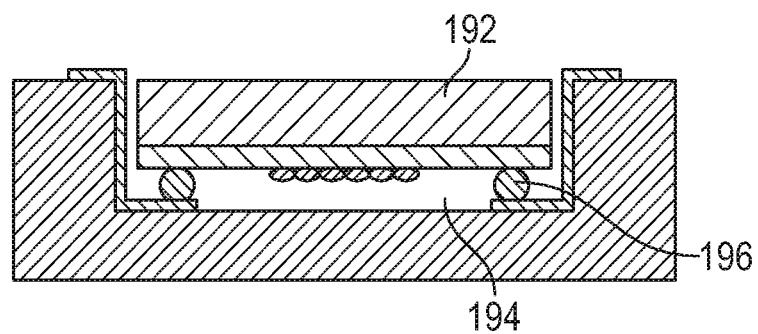
FIG. 28 is a cross sectional view of a semiconductor device bonded into a cavity of a glass block.

Referring to FIG. 26-33, a semiconductor package implementation is illustrated after various processing steps of an implementation of a method of forming a semiconductor package. Referring to FIG. 26, a glass block 184 following forming a cavity therein is illustrated. The cavity may be formed through any method disclosed herein. In various implementations, the glass may be hole patterned glass. As illustrated in FIG. 27, the package is illustrated after coupling a plurality of traces 186 to an inner surface 190 of the cavity 188. In various implementations, the traces may be made of gold, copper, nickel, lead/tin, or other electrically conductive materials (including non-metallic materials). Referring to FIG. 28, the package is illustrated after bonding a semiconductor device 192 into the cavity 194. The semiconductor device may be electrically coupled to the metal traces through solder balls 196. In other implementations, the interconnects 196 may include gold stud bumps. In this particular implementation, the device 192 does not include vias. The device may include a redistribution layer or a passivation layer on the first side of the die.

Figure 29:
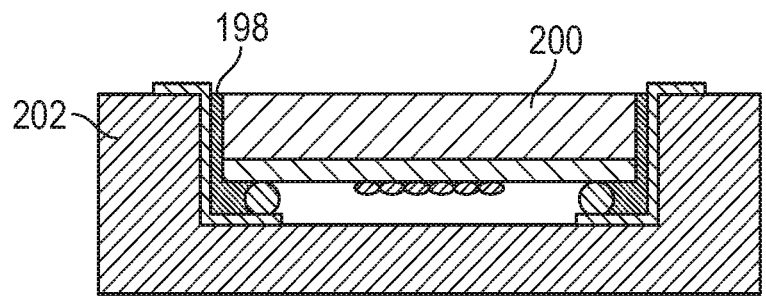
FIG. 29 is a cross sectional view of an implementation of a semiconductor device sealed within a glass bock.
Figure 30:
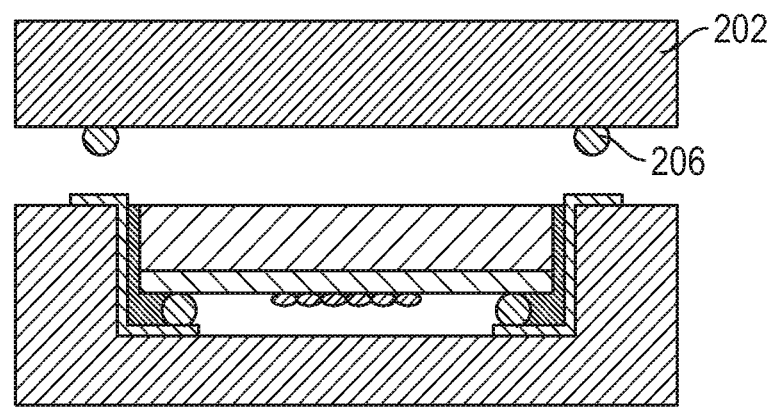
FIG. 30 is a cross sectional view of an implementation of a semiconductor device in a glass block and a substrate.
Figure 31:
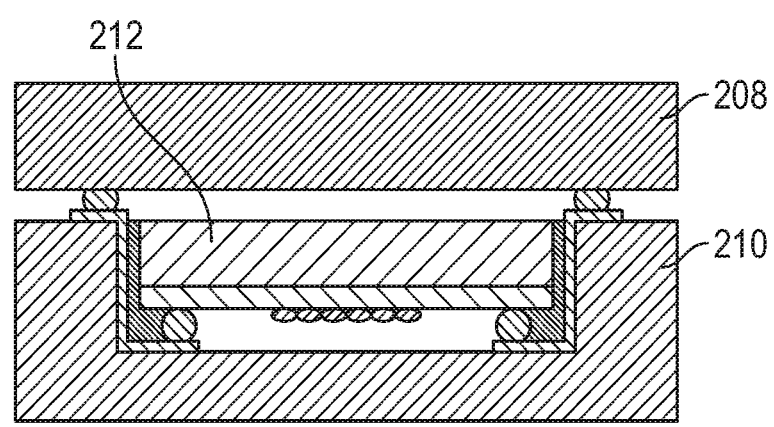
FIG. 31 is a cross sectional view of an implementation of a substrate coupled to a semiconductor device and over an opening of a cavity.

Referring to FIG. 29, the package implementation is illustrated after using an opaque filling material 198 to seal the semiconductor device 200 within the cavity 200. The opaque filling material may seal the gaps around the semiconductor device 200 to form a hermetic seal. The opaque filling material may be optically opaque and may block particular wavelengths of light from contacting the edge of the semiconductor device (and/or may block any other wavelength of electromagnetic radiation desired as disclosed in this document). Referring to FIG. 30, a substrate 202 is illustrated having solder balls 206 on a second side of the substrate. Through pick and place, the substrate 208 is illustrated as being readied to be mechanically and electrically coupled to the semiconductor device and the edges of the glass block 210 as illustrated in FIG. 31.

Figure 32:
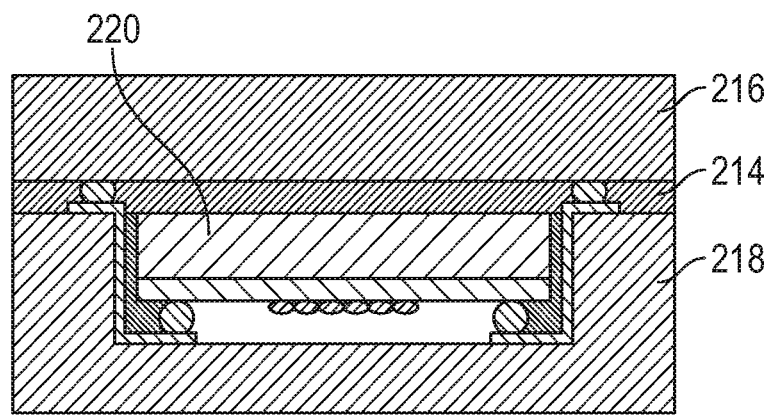
FIG. 32 is a cross sectional view of an implementation of a semiconductor package.
Figure 33:
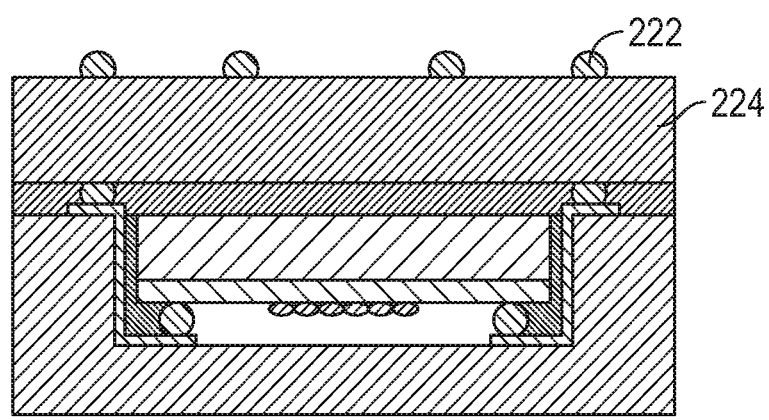
FIG. 33 is a cross sectional view of an implementation of a semiconductor device having interconnects coupled thereto.

Referring to FIG. 32, a gap between the substrate 216, the semiconductor device 220, and the glass block 218 surrounding the cavity is filled with underfill 214 material. Referring to FIG. 33, the package is illustrated after coupling a ball grid array 22 to a first side of the substrate 224.

In various implementations, other interconnects types may be used such as, by non-limiting example, solder balls, land grid arrays, studs, or other suitable interconnects for flip chip packaging.

Figure 34:
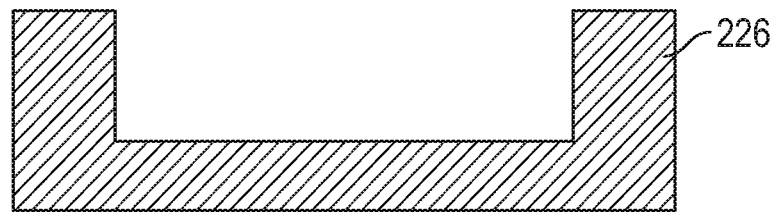
FIG. 34 is a side view of an implementation of a glass block having a cavity formed therein.
Figure 35:
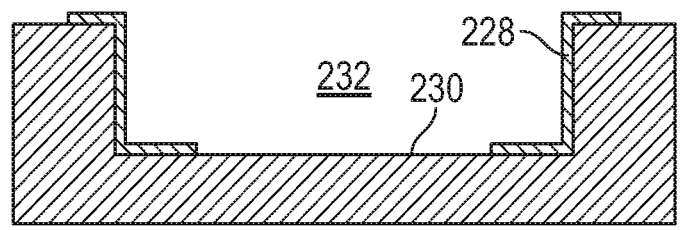
FIG. 35 is a cross sectional view of an implementation of a glass block having a plurality of metal traces therein.
Figure 36:
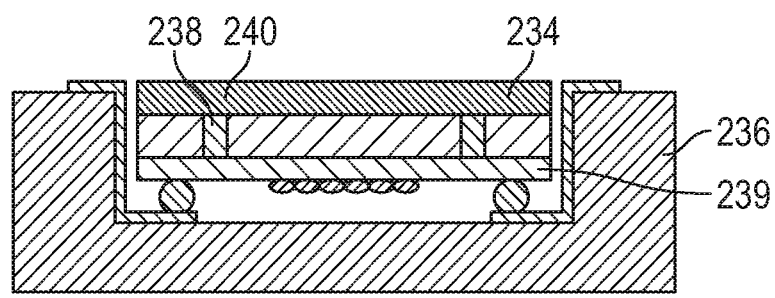
FIG. 36 is a cross sectional view of a semiconductor device bonded into a cavity.

Referring to FIG. 34-41, a package implementation is illustrated after various processing steps of another implementation of a method of forming a semiconductor package. Referring to FIG. 34, the a glass block 226 is illustrated after forming a cavity therein. The cavity may be formed through any of the forming techniques disclosed in this document including dry etching and wet etching. In other implementations, the cavity may be formed through casting. In various implementations, the glass may be hole patterned glass. As illustrated in FIG. 36, the method also includes coupling a plurality of traces 228 to an inner surface 230 of the cavity 232. In various implementations, the traces may include gold, copper, nickel, lead/tin or other electrically conductive materials (including non-metallic materials). Referring to FIG. 36, the package is illustrated after bonding a semiconductor device 234 into the cavity of the glass block 236. The semiconductor device 234 may be electrically coupled through a flip chip process by the solder balls coupling with the metal traces. In this particular implementation, the semiconductor device 234 includes vias 238 extending from the sensor site interconnections to the redistribution layer 234 on the first side of the semiconductor device.

Figure 37:
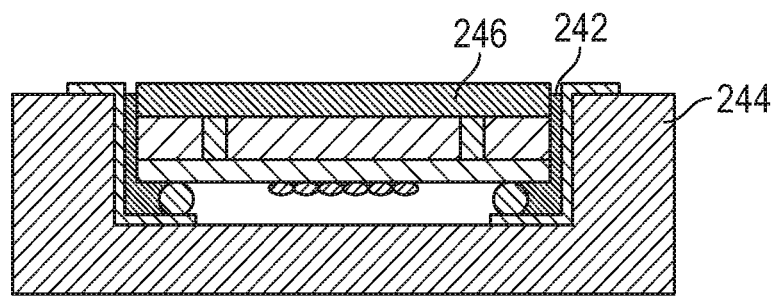
FIG. 37 is a cross sectional view of an implementation of an image sensor sealed within a glass block.
Figure 38:
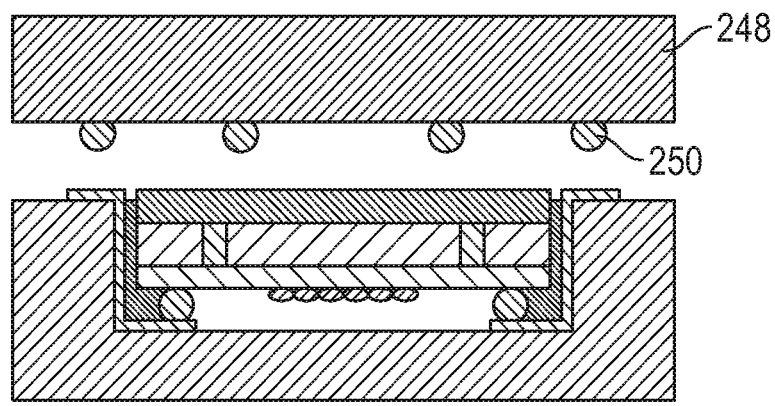
FIG. 38 is a cross sectional view of an implementation of semiconductor device in a glass block along with a substrate.
Figure 39:
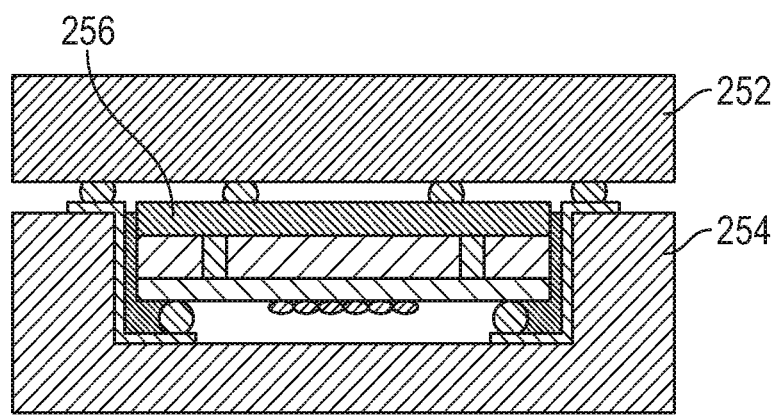
FIG. 39 is a cross sectional view of an implementation of a substrate coupled to a semiconductor device and over an opening of a cavity.

Referring to FIG. 37, the package is illustrated after using an opaque filling material 242 to seal the semiconductor device 246 within the cavity 244. The filling may be optically opaque to block particular wavelengths of light from contacting the edge of the semiconductor device including any wavelength of electromagnetic radiation disclosed in this document. Referring to FIG. 38, a substrate 248 may be prepared having solder balls 250 on a second side of the substrate. FIG. 39 illustrates the package after mechanically and electrically coupling the substrate 252 to the semiconductor device 256 and the edges of the glass block 254. The substrate may be handled using a pick and place system during this process. In this particular implementation, four solder balls are used in the flip chip method of bonding. Here, the substrate is electrically coupled to the semiconductor die both through a first side of the die and around the die through the metal traces. This is in contrast to the package formed and illustrated in FIG. 33, where the electrical connection go around the die rather than through the die.

Figure 40:
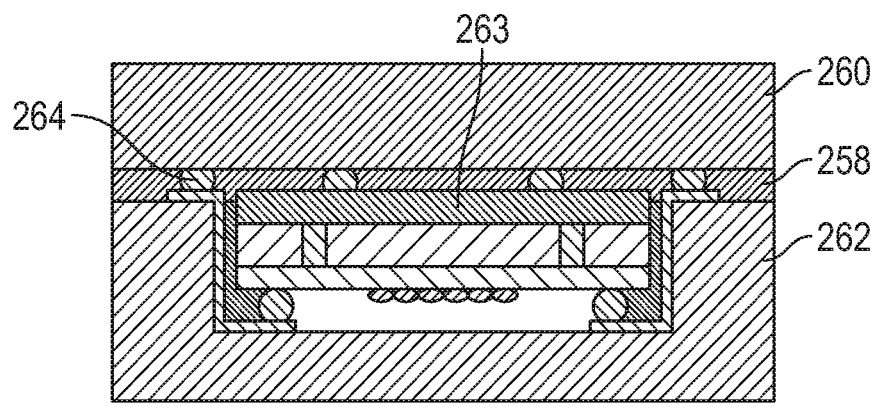
FIG. 40 is a cross sectional view of an implementation of a semiconductor package.
Figure 41:
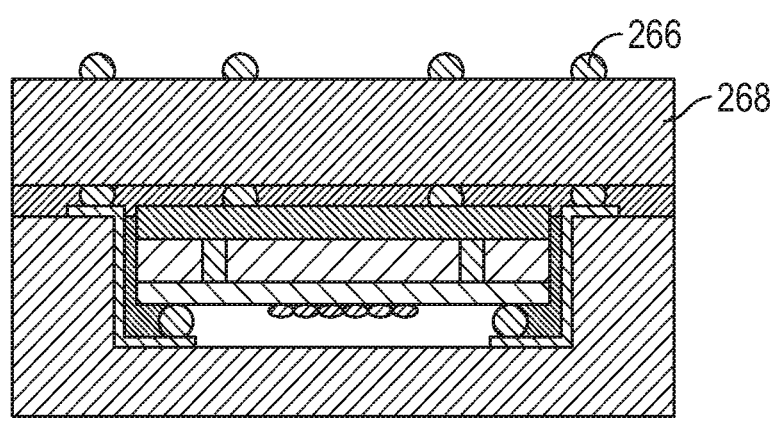
FIG. 41 is a cross sectional view of an implementation of a semiconductor device having interconnects coupled thereto.

Referring to FIG. 40, the package is illustrated after underfilling a gap between the substrate 260, the semiconductor die, and the sides of the glass block 262 using an underfill material 258. The underfill material may act as an insulator for the electrical connections between the substrate and the die. The underfill material may also form a hermetic seal around the die and perform any of the functions disclosed with respect to fill materials. Referring to FIG. 41, the package is illustrated after coupling a ball grid array 266 or other interconnects to a first side of the substrate 268. In various implementations, other interconnects may be used, including, by non-limiting example, solder balls, land grid arrays, studs, or other suitable interconnects for flip chip packaging.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
 a semiconductor device comprised within a cavity within a glass block;
 a substrate coupled with a first side of the semiconductor device and two or more edges of the glass block;
 a fill material comprised between the substrate and the semiconductor device;
 an opaque material between a side surface of the semiconductor device and an inner surface of the cavity; and
 an air gap between the glass block and the semiconductor device;
 wherein the opaque material is configured to block light from contacting the side surface of the semiconductor device.

2. The semiconductor package of claim 1, wherein the semiconductor device is coupled to the substrate through solder.

3. The semiconductor package of claim 1, further comprising vias comprised within the semiconductor device.

4. The semiconductor package of claim 1, wherein the semiconductor device is an image sensor.

5. The semiconductor package of claim 1, further comprising two or more standoff structures between the inner cavity within the glass block and a second side of the semiconductor device.

6. The semiconductor package of claim 1, further comprising a plurality of metal traces comprised within the inner surface of the cavity within the glass block.

7. The semiconductor package of claim 6, further comprising solder balls between the second side of the semiconductor device and the metal traces.

8. The semiconductor package of claim 1, wherein the cavity has a shape that is cuboidal.

9. A method of forming a semiconductor package, the method comprising:
 forming a cavity within a glass block;
 coupling two or more standoff units to an inner surface of the cavity;
 bonding a semiconductor device to the two or more standoffs;
 sealing the semiconductor device within the cavity using an opaque filling material;
 mechanically and electrically coupling a substrate to the semiconductor device and over an opening of the cavity;
 underfilling a gap between the substrate, the semiconductor device, and a side of the glass block surrounding the cavity with an underfill material; and
 forming an air gap between the semiconductor device and the inner surface of the cavity of the glass block;
 wherein the opaque filling material is configured to block light from contacting an edge of the semiconductor device.

10. The method of claim 9, further comprising coupling a ball grid array to a second side of the substrate.

11. The method of claim 9, wherein the substrate is coupled to the semiconductor device through solder.

12. The method of claim 9, wherein the semiconductor device is an image sensor.

13. The method of claim 9, further comprising vias comprised within the semiconductor device.

14. The method of claim 9, wherein mechanically and electrically coupling a substrate to the semiconductor device further comprises using solder balls.

15. A method of forming a semiconductor package, the method comprising:
 forming a cavity within a glass block;
 coupling a plurality of metal traces to an inner surface of the cavity;
 bonding a semiconductor device into the cavity;
 sealing the semiconductor device within the cavity using an opaque filling material;
 mechanically and electrically coupling a substrate to the semiconductor device and over an opening of the cavity; and
 underfilling a gap between the substrate, the semiconductor device, and a side of the glass block surrounding the cavity using an underfill material;
 wherein the opaque filling material is configured to block light from contacting an edge of the semiconductor device and
 wherein bonding the semiconductor device into the cavity forms an air gap between the semiconductor device and the glass block.

16. The method of claim 15, further comprising coupling a ball grid array to a second side of the substrate.

17. The method of claim 15, wherein the substrate is coupled to the semiconductor device through solder.

18. The method of claim 15, wherein the semiconductor device is an image sensor.

19. The method of claim 15, further comprising vias comprised within the semiconductor device.

20. The method of claim 15, wherein bonding further comprises bonding solder balls between the second side of the semiconductor device and the plurality of metal traces.

* * * * *